US008027162B2

(12) United States Patent
Campbell et al.

(10) Patent No.: US 8,027,162 B2
(45) Date of Patent: Sep. 27, 2011

(54) LIQUID-COOLED ELECTRONICS APPARATUS AND METHODS OF FABRICATION

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Michael R. Rizzolo, Red Hook, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 12/566,081

(22) Filed: Sep. 24, 2009

(65) Prior Publication Data

US 2011/0069454 A1 Mar. 24, 2011

(51) Int. Cl.
*H05K 7/20* (2006.01)
*G06F 1/20* (2006.01)

(52) U.S. Cl. .............. 361/699; 361/679.47; 361/679.53; 361/679.54; 361/704; 361/716; 361/719; 361/720; 361/721; 165/104.33; 165/185

(58) Field of Classification Search .......... 361/679.46–679.47, 679.52–679.54, 361/689–690, 702, 704, 719–721, 699–700; 165/80.2–80.4, 104.33, 185; 174/15.2, 16.3
See application file for complete search history.

(56) References Cited

U.S. PATENT DOCUMENTS 5,640,018 A * 6/1997 Suzuki et al. ................. 250/368
6,480,014 B1   11/2002 Li et al.
7,151,668 B1 * 12/2006 Stathakis ..................... 361/700
7,233,501 B1    6/2007 Ingalz
7,286,355 B2 * 10/2007 Cheon .......................... 361/699
7,289,327 B2 * 10/2007 Goodwin et al. ............. 361/701

(Continued)

FOREIGN PATENT DOCUMENTS

CN   201222836 Y  *  4/2009

(Continued)

OTHER PUBLICATIONS

Campbell et al., "High Performance Dual-In-Line Memory (DIMM) Array Liquid Cooling Assembly and Method", U.S. Appl. No. 12/418,973, filed Apr. 6, 2009.

(Continued)

*Primary Examiner* — Robert J Hoffberg
(74) *Attorney, Agent, or Firm* — Dennis Jung, Esq.; Kevin P. Radigan, Esq.; Heslin Rothenberg Farley & Mesiti, P.C.

(57) ABSTRACT

Liquid-cooled electronics apparatuses and methods are provided. The cooled electronics apparatuses include a liquid-cooled cold rail and an electronics subassembly. The liquid-cooled cold rail has a thermally conductive structure and a coolant-carrying channel extending within and cooling the thermally conductive structure. The electronics subassembly includes an electronics card(s) and one or more thermal transfer plates. The electronics card(s) includes electronic devices to be cooled, and the one or more thermal transfer plates are each rigidly affixed to one or more electronic devices of the electronics card(s). Each thermal transfer plate is thermally conductive and couples the electronics subassembly to the liquid-cooled cold rail to thermally interface the one or more electronic devices to the liquid-cooled cold rail to facilitate cooling of the electronic devices. In one embodiment, the electronics subassembly includes multiple interleaved electronics cards and thermal transfer plates.

20 Claims, 14 Drawing Sheets

U.S. PATENT DOCUMENTS

| | | | |
|---|---|---|---|
| 7,365,985 B1 | 4/2008 | Ni | |
| 7,443,672 B2 | 10/2008 | Peng et al. | |
| 7,595,550 B2 | 9/2009 | Cady et al. | |
| 7,639,498 B2 * | 12/2009 | Campbell et al. | 361/699 |
| 7,684,196 B2 | 3/2010 | Eckberg et al. | |
| 7,791,881 B2 * | 9/2010 | Chou et al. | 361/695 |
| 7,796,393 B2 | 9/2010 | Legen et al. | |
| 7,796,399 B2 | 9/2010 | Clayton et al. | |
| 7,855,888 B2 * | 12/2010 | Peterson | 361/699 |
| 7,876,564 B2 * | 1/2011 | Monh et al. | 361/700 |
| 7,907,398 B2 * | 3/2011 | Hrehor et al. | 361/679.53 |
| 2006/0146497 A1 | 7/2006 | Gauche et al. | |
| 2006/0250772 A1 * | 11/2006 | Salmonson et al. | 361/698 |
| 2008/0062652 A1 * | 3/2008 | Lieberman et al. | 361/715 |
| 2008/0259566 A1 | 10/2008 | Fried | |
| 2009/0002951 A1 * | 1/2009 | Legen et al. | 361/715 |
| 2009/0080151 A1 * | 3/2009 | Kalms et al. | 361/679.52 |
| 2009/0120607 A1 * | 5/2009 | Cheon et al. | 165/46 |
| 2009/0219687 A1 * | 9/2009 | Lin | 361/695 |
| 2009/0277616 A1 * | 11/2009 | Cipolla et al. | 165/104.33 |
| 2010/0025010 A1 * | 2/2010 | Cipolla et al. | 165/47 |
| 2010/0027220 A1 | 2/2010 | Hughes et al. | |
| 2010/0085712 A1 * | 4/2010 | Hrehor et al. | 361/699 |
| 2010/0091447 A1 * | 4/2010 | Jaggers et al. | 361/679.47 |
| 2010/0252234 A1 * | 10/2010 | Cambell et al. | 165/80.2 |
| 2010/0254089 A1 * | 10/2010 | Anderl et al. | 361/702 |

FOREIGN PATENT DOCUMENTS

| | | | |
|---|---|---|---|
| JP | 01077199 A | * | 3/1989 |
| JP | 2008203717 A | * | 9/2008 |
| TW | 323643 U | * | 12/2007 |
| TW | 200937175 A | * | 9/2009 |

OTHER PUBLICATIONS

Campbell et al., "Liquid-Cooled Cooling Apparatus, Electronics Rack and Methods of Fabrication Thereof", U.S. Appl. No. 12/481,824, filed Jun. 10, 2009.

IBM Technical Disclosure, "Highly-Efficient Copper Rail Design for Optimized Cooling of DRAM Modules", IPCOM000184053D (Jun. 9, 2009).

* cited by examiner

LIQUID-COOLED ELECTRONICS APPARATUS AND METHODS OF FABRICATION

BACKGROUND

The present invention relates to heat transfer mechanisms, and more particularly, to cooling apparatuses, liquid-cooled electronics racks and methods of fabrication thereof for removing heat generated by electronic devices within one or more electronic subsystems.

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices and systems therefore mandates the development of aggressive thermal management techniques using liquid cooling.

BRIEF SUMMARY

In one aspect, the shortcomings of the prior art are overcome and additional advantages are provided through the provision of a cooled electronics apparatus which includes a liquid-cooled cold rail and an electronics subassembly. The liquid-cooled cold rail is a thermally conductive structure with at least one coolant-carrying channel extending therein. The electronics subassembly includes: at least one electronics card comprising at least one electronic device to be cooled; and at least one thermal transfer plate rigidly affixed to the at least one electronic device of the at least one electronics card. The at least one thermal transfer plate is thermally conductive and couples the electronics subassembly to the liquid-cooled cold rail to thermally interface the at least one electronic device to the liquid-cooled cold rail to facilitate cooling thereof.

In another aspect, a liquid-cooled electronics rack is provided. The liquid-cooled electronics rack includes: an electronics rack comprising at least one electronics subsystem; at least one liquid-cooled cold rail, each liquid-cooled cold rail being associated with a respective electronics subsystem of the at least one electronics subsystem, and each liquid-cooled cold rail comprising a thermally conductive structure with at least one coolant-carrying channel extending therein; and wherein the at least one electronics subsystem comprises at least one electronics subassembly. Each electronics subassembly includes: at least one electronics card comprising at least one electronic device to be cooled; and at least one thermal transfer plate rigidly affixed to the at least one electronic device of the at least one electronics card, the at least one thermal transfer plate being thermally conductive and coupling the electronics subassembly to one liquid-cooled cold rail of the at least one liquid-cooled cold rail to thermally interface the at least one electronic device to the one liquid-cooled cold rail to facilitate cooling of the at least one electronic device.

In a further aspect, a method of fabricating a cooled electronics apparatus is provided. The method includes: providing a liquid-cooled cold rail comprising a thermally conductive structure with at least one coolant-carrying channel extending therein; providing an electronics subassembly, the electronics subassembly including at least one electronics card comprising at least one electronic device to be cooled, and at least one thermal transfer plate rigidly affixed to the at least one electronic device of the at least one electronics card, the at least one thermal transfer plate being thermally conductive; and coupling the at least one thermal transfer plate of the electronics subassembly to the liquid-cooled cold rail to thermally interface the at least one electronic device to the liquid-cooled cold rail to facilitate cooling thereof.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
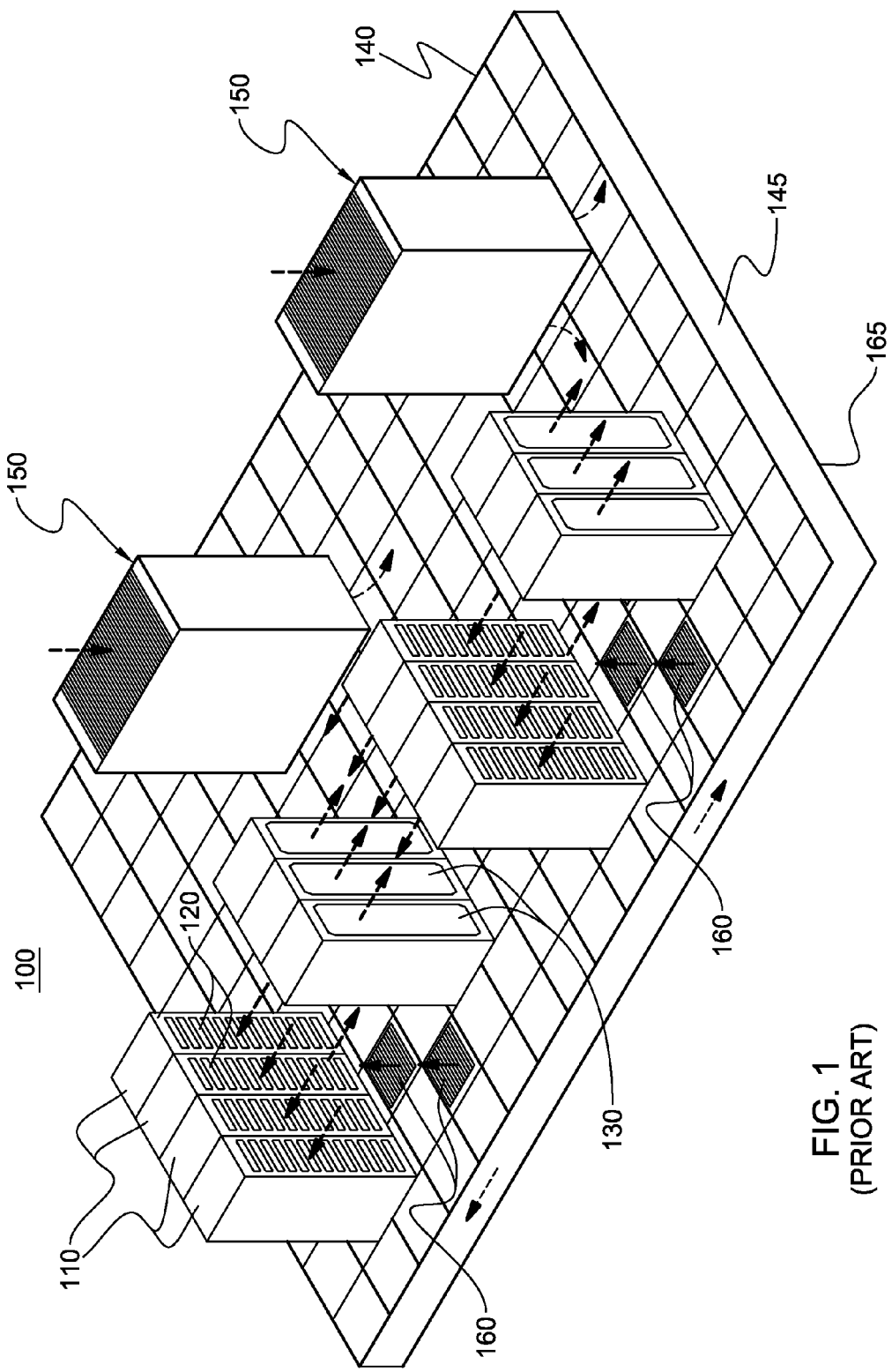
FIG. 1 depicts one embodiment of a conventional raised floor layer of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronic drawers and blades of a blade center system being two examples of subsystems of an electronics rack to be cooled.

"Heat-generating component" or "electronic device" refers to any heat-generating electronic component of, for example, a computer system or other electronic subsystem or unit requiring cooling. By way of example, an electronic device may comprise one or more integrated circuit dies (or chips) and/or other electronic components to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubings (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings (which are not drawn to scale for ease of understanding thereof), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
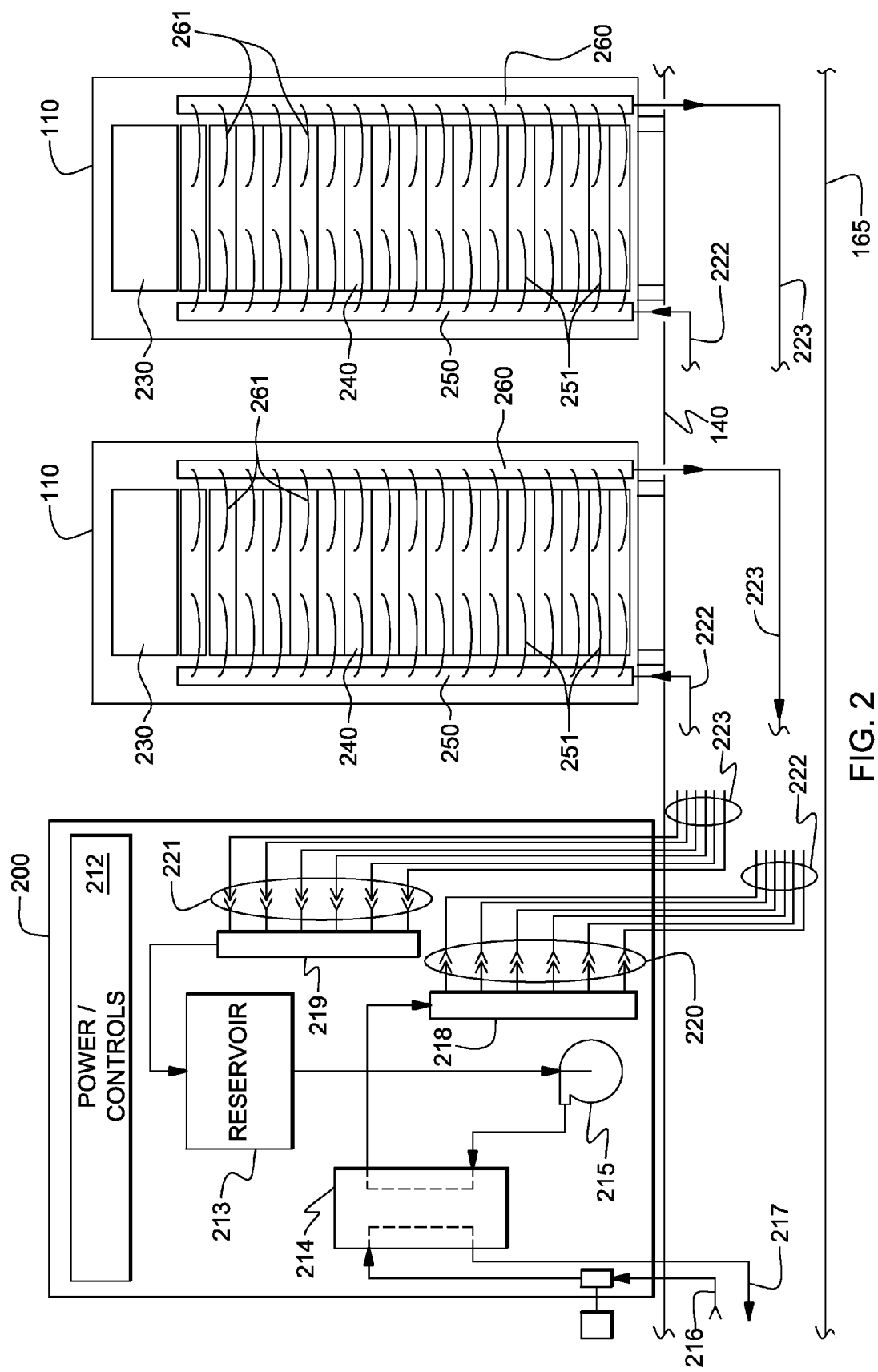
FIG. 2 depicts one embodiment of a coolant distribution unit for liquid-cooling of one or more electronics racks of a data center, in accordance with an aspect of the present invention.
Figure 3:
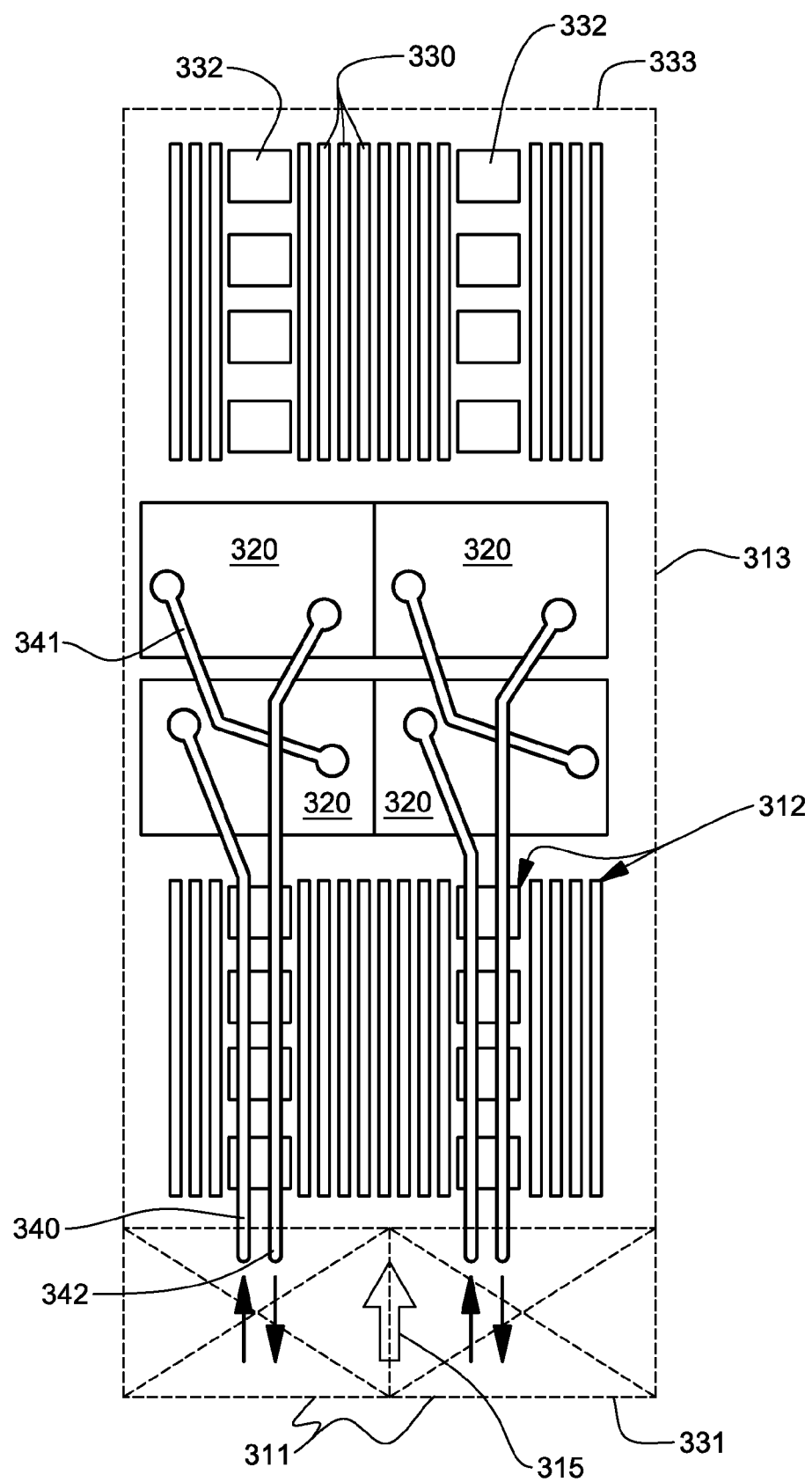
FIG. 3 is a plan view of one embodiment of an electronic subsystem layout illustrating an air and liquid cooling system for cooling components of the electronic subsystem, in accordance with an aspect of the present invention.
Figure 4:
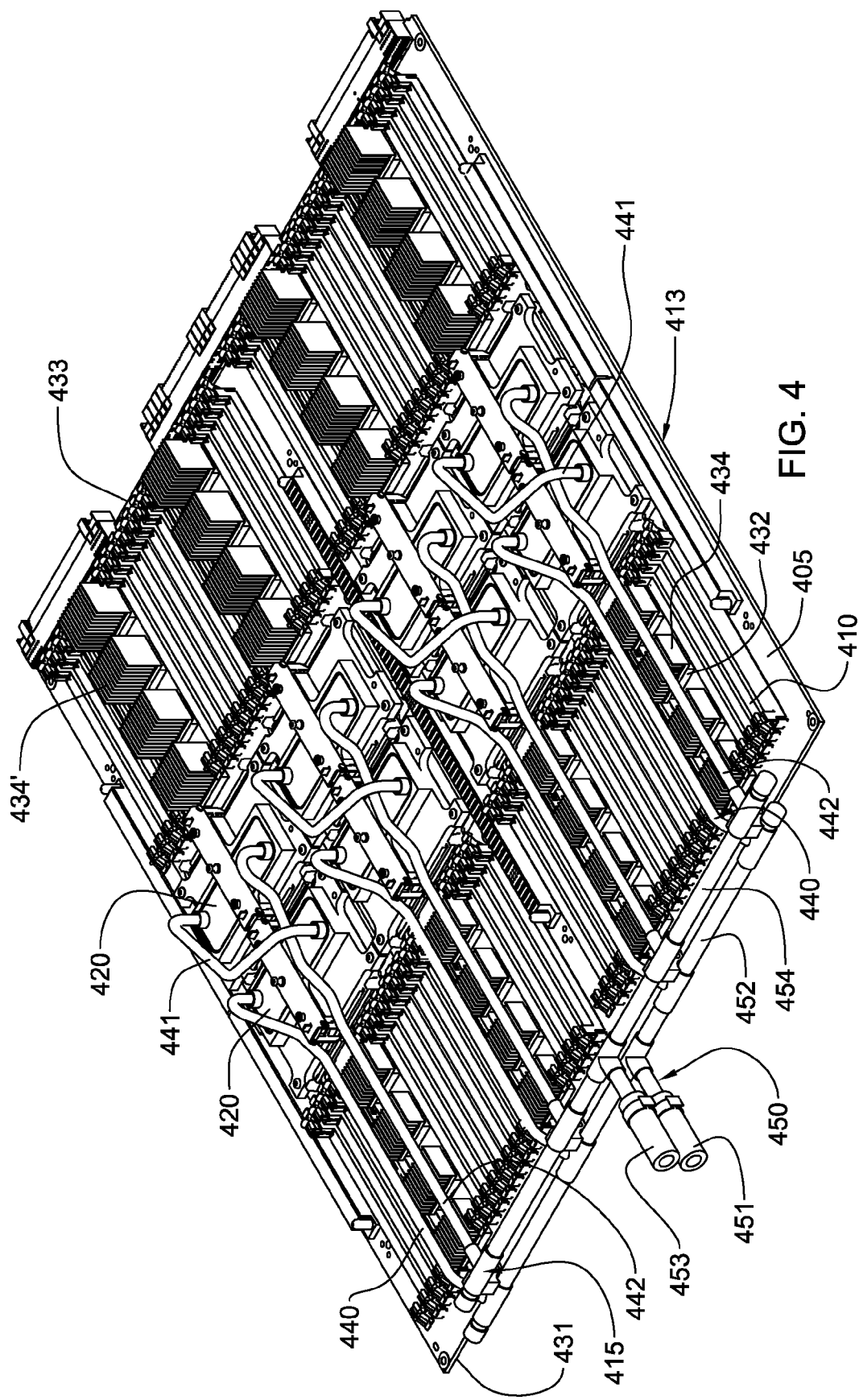
FIG. 4 depicts one detailed embodiment of a partially assembled electronic subsystem, wherein the electronic subsystem includes eight primary heat-generating electronic devices to be cooled, each having a respective cooling device associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts, in part, one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises (in on embodiment) a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 442. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

In addition to cooling high heat flux microprocessor modules, there exists a need to address cooling of certain secondary heat-generating components, such as board memory. With the increase in bandwidth and server throughput, large amounts of board memory are required to achieve increased performance of the electronics subsystem. As the amount of memory in servers continues to increase, so do the number of standard memory packages, such as dual in-line memory modules (DIMMs). Since each package has an ever-increasing power dissipation and tighter DIMM row spacings associated with it, memory modules can contribute as much as 50% of the total server heat load. Although numerous DIMM cooling schemes are conceivable, they generally do no allow for the ready addition or replacement of DIMMs within the electronics subsystem.

Figure 5:
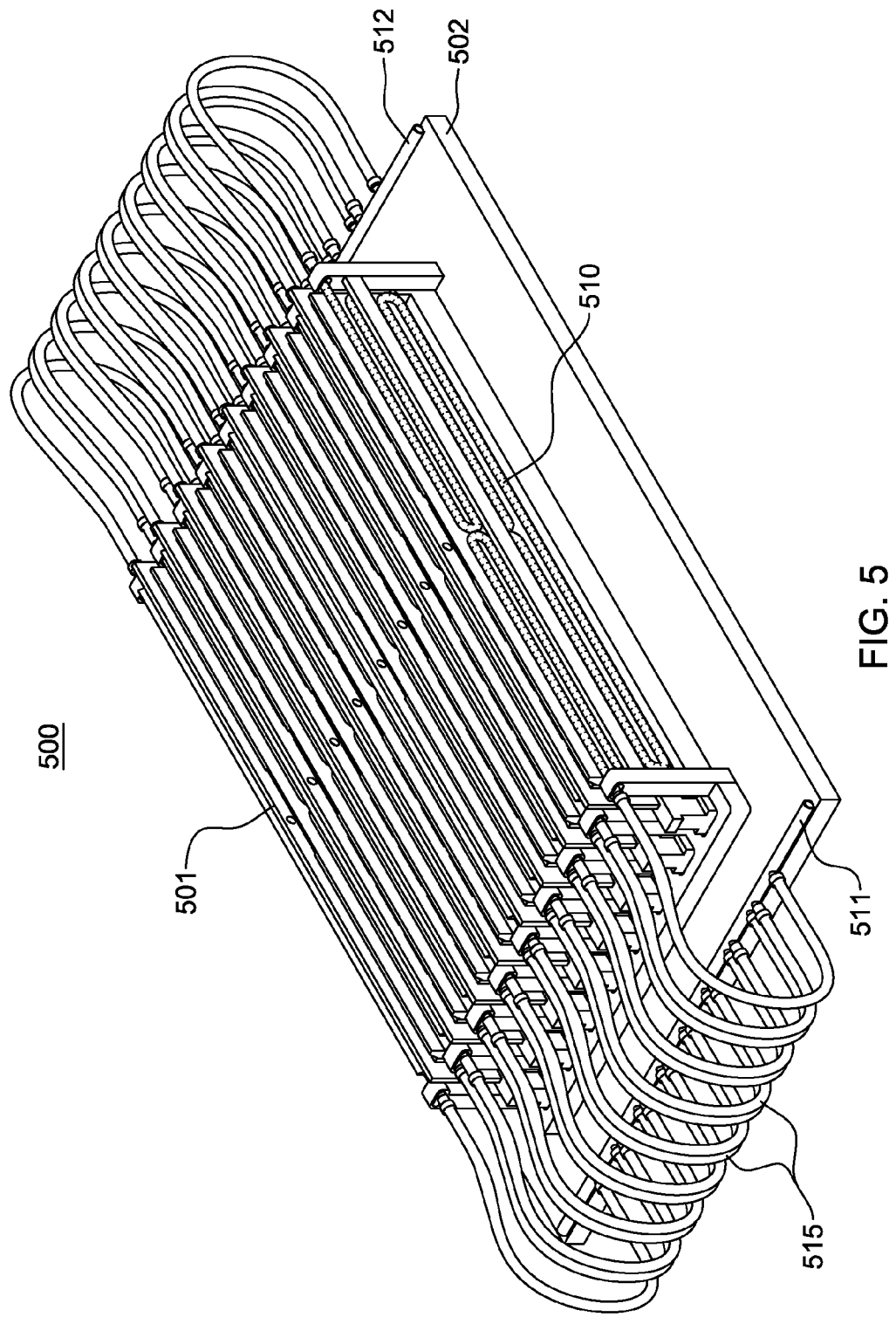
FIG. 5 depicts one embodiment of a liquid cooling assembly for multiple Dual In-Line Memory Modules (DIMMs), in accordance with an aspect of the present invention.

FIG. 5 depicts one embodiment of a liquid cooling assembly 500 addressing this need. In this implementation, the electronic devices to be cooled comprise DIMM arrays 501 disposed on a circuit board (or mother board) 502, as shown. Each array is cooled by a cooling component 510 cooled via coolant passing therethrough from a supply manifold 511 to a return manifold 512. The coolant components connect to both the supply and return manifolds via flexible tubing 515.

In the illustrated example, a plurality of DIMM arrays 501 and cooling components 510 are provided to create the liquid-cooling assembly 500. The supply manifold 511 is a common supply used to supply coolant to the plurality of cooling components 510, and the return manifold 512 is a common return manifold used to exhaust coolant from the plurality of cooling components 510. In one embodiment, cooling components 510 comprise cooling plates thermally coupled to heat dissipating components on the DIMM arrays. In addition, in order to provide constant and continuous contact between the plates and the active components, contact means (such as springs or other elements) can be provided. In this embodiment, flexible tubing 515 advantageously allows for easy removal and installation of DIMMs (or other similar arrays). This is in part due to the flexibility of the tubings 515, which allow for at least some movement during the removal or installation process. In one embodiment, the flexible tubings are contrasted with the stable socket support system that is rigidly affixed to the circuit board (or mother board) 502. When a plurality of cooling components 510 are used in connection with a plurality of DIMM arrays, cooling components 510 flank DIMM arrays 501, as shown in FIG. 5.

Although the implementation of FIG. 5 is advantageous, further cooled electronics apparatus implementations are deemed desirable for electronics subsystems, and particularly apparatuses which allow for cooling of DIMMs within such subsystems without the need for flexible tubings and their associated connections.

FIGS. 6-8B illustrate one embodiment of such a cooled electronics apparatus for an electronics subsystem. This cooled electronics apparatus comprises one or more liquid-cooled DIMM field replaceable units (FRUs), or more generally, one or more electronics subassemblies, in accordance with an aspect of the present invention.

Figure 6:
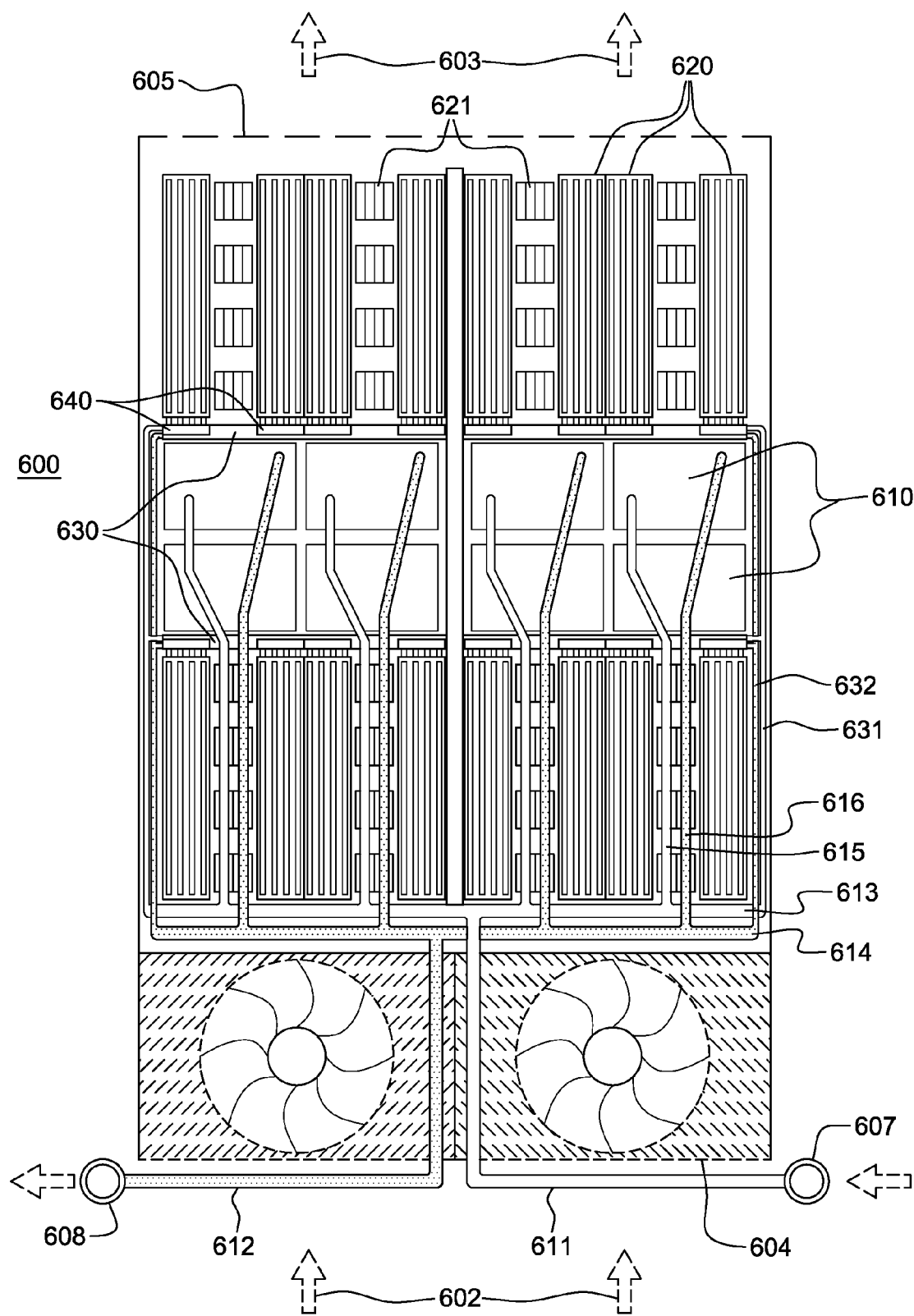
FIG. 6 is a plan view of one embodiment of an electronics subsystem of a liquid-cooled electronics rack, shown comprising multiple cooled electronics apparatuses, in accordance with an aspect of the present invention.

FIG. 6 depicts one embodiment of an electronics subsystem, generally denoted 600, for an electronics rack. As illustrated, electronics subsystem 600 includes one or more air-moving devices, which provide forced cool airflow 602 to cool multiple heat-generating components within the electronics subsystem. Cool airflow 602 is taken in through a front 604 and exhausted out a back 605 of the subsystem as heated exhaust airflow 603. The multiple components to be cooled include multiple processor modules to which liquid-cooled cold plates 610 are coupled, as well as multiple arrays of memory modules, which in this embodiment, are assembled as electronics subassemblies 620. In one example, the electronics subassemblies are each a Liquid-Cooled DIMM FRU (or LCDF), which are shown interspersed between multiple rows of memory support modules 621. In the example depicted in FIG. 6, sixteen electronics subassemblies (e.g., sixteen liquid-cooled DIMM FRUs) are illustrated, by way of example only.

The illustrated electronics subsystem 600 further includes a coolant inlet line 611 coupled in fluid communication with a rack-level coolant inlet manifold 607, and a coolant outlet line 612 coupled in fluid communication with a rack-level coolant outlet manifold 608. Coolant supply line 611 and return line 612 are in fluid communication with a coolant supply header 613 and coolant return header 614, respectively, for electronics subsystem 600. As illustrated, and by way of example only, multiple coolant supply and return line pairs 615, 616, are each connected in series or parallel fluid communication with two liquid-cooled cold plates 610 to facilitate the flow of liquid coolant therethrough. In addition, multiple liquid-cooled cold rails 630 (comprising part of multiple cooled electronics apparatuses) are provided, each disposed at one end of a plurality of electronics subassemblies 620. Each liquid-cooled cold rail 630 includes one or more coolant-carrying channels 635 (see FIG. 7B) extending therein which allow for the passage of coolant through the cold rail. This coolant is supplied via coolant rail supply and return lines 631, 632, respectively, which couple to the respective coolant supply and return headers 613, 614 and are disposed along the sides of electronics subsystem 600 (by way of example only). Multiple thermal conduction blocks 640 are coupled to the liquid-cooled cold rails 630 to facilitate thermal interfacing of a plurality of thermal transfer plates (described below) of the electronics subassemblies to the liquid-cooled cold rails. As illustrated, each cold rail is used to cool several electronics subassemblies (e.g., LCDF) structures.

Figure 7A:
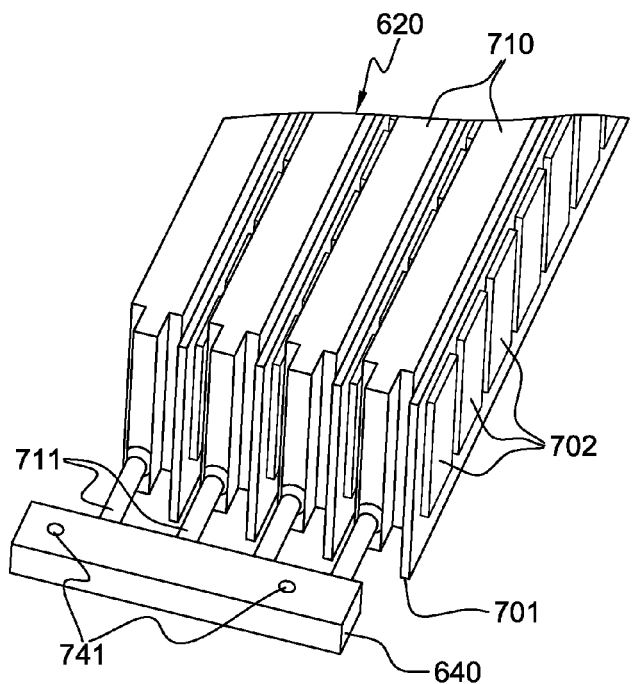
FIG. 7A is a perspective view of one embodiment of an electronics subassembly and a thermal conduction block of a cooled electronics apparatus, in accordance with an aspect of the present invention.
Figure 7B:
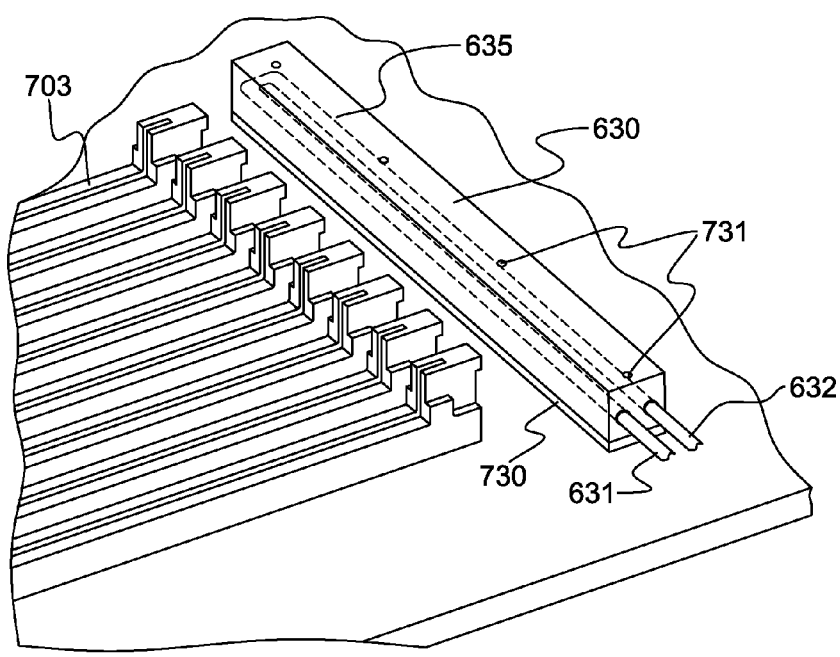
FIG. 7B is a partially assembled view of an electronics subsystem and a cooled electronics apparatus, wherein electronic card sockets and a liquid-cooled cold rail are illustrated, in accordance with an aspect of the present invention.

FIGS. 7A & 7B depict one detailed embodiment of the components of a cooled electronics apparatus, such as the cooled electronics apparatuses illustrated in FIG. 6.

In FIG. 7A, the cooled electronics apparatus includes electronics subassembly 620, which includes multiple electronics cards 701, each having a plurality of electronic devices 702 disposed on the main sides thereof. In one example, electronics cards 701 with electronic devices 702 are each a Dual In-line Memory Module (DIMM) card or array, with four such arrays being illustrated in FIG. 7A. Interleaved with electronics cards 701 are a plurality of thermal transfer plates 710. Each thermal transfer plate 710 is rigidly affixed to one or more of the electronic devices 702 on the opposing sides of adjacent electronics cards 701. Thermal conduction is facilitated by providing an epoxy, solder, a thermally conductive pad, or other interstitial thermally conductive layer, between the thermal transfer plate and the one or more electronic devices. In one embodiment, the electronic devices are chemically or metallurgically affixed to the respective thermal transfer plate to ensure good thermal conduction paths between the electronic devices and the thermal transfer plate. The result is a monolithic, unitary electronics subassembly 620, which may be installed or removed as a unit (i.e., a field replaceable unit). Each thermal transfer plate 710 within the subassembly is thermally conductive and couples the electronics subassembly 620 to (for example) an associated thermal conduction block 640, which as noted above in connection with FIG. 6, is coupled to one of the liquid-cooled cold rails 630 of the cooled electronics apparatus. By way of example, retention screws 741 are provided in thermal conduction blocks 640 to securely affix the thermal conduction blocks to the respective liquid-cooled cold rail(s) 630 (see FIG. 8A).

As noted, the thermal transfer plates 710 may be chemically or metallurgically bonded to the respective electronic devices 702 (e.g., memory modules) using, for example, epoxy or a solder, provided that the means for rigidly affixing allows for transfer of thermal energy from electronic devices 702 to thermal transfer plates 710, as described herein. In one embodiment, each thermal transfer plate 710 couples along a first main side to a plurality of electronic devices 702 affixed to a first electronics card 701, and along a second main side to a plurality of electronic devices 702 affixed to a second electronics card 701, with the result being that thermal transfer plates 710 and electronics cards 701 are interleaved within electronics subassembly 620.

Thermal transfer plates 710 include thermally conductive extensions 711 at least one end thereof configured to physically contact (for example) a respective thermal conduction block 640. If desired, recesses (or openings) are provided in thermal conduction block 640 sized to receive the respective extensions 711 of thermal transfer plates 710. In one embodiment, the thermally conductive extensions 711 comprise protruding portions of one or more heat pipes disposed within the thermal transfer plates. As is well known, a heat pipe may comprise a hollow structure with a wick or screen-like matrix that allows heat to migrate from one end of the member to another end. A high concentration of vapor may exist closer to the heat source (e.g., closer to the electronic device(s)), with a lower concentration of vapor at the condenser end of the heat pipe (e.g., closer to thermal conduction block 640). The result is a mass flow from one end to the other end of the member, which takes advantage of the latent thermal capacity of the vapor to carry heat from one end to the other. In one embodiment, the thermal transfer plate could be fabricated by drilling one or more appropriately sized holes in a block of thermally conductive material, such as copper or aluminum, after which cylindrical-shaped heat pipes may be inserted therein, with the heat pipe portion(s) extending therefrom being the thermally conductive extensions 711.

Figure 8A:
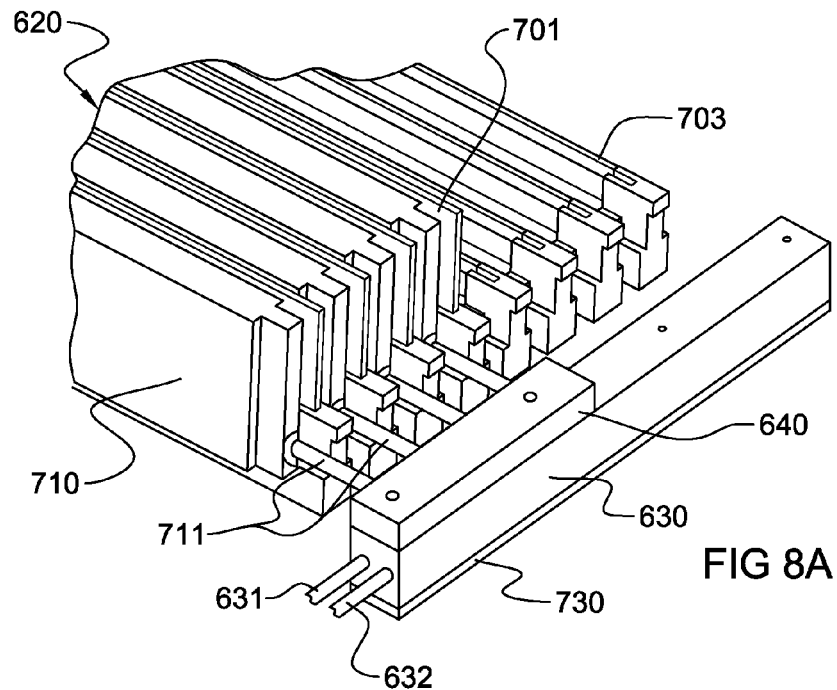
FIG. 8A is a partially assembled cooled electronics apparatus, illustrating one embodiment of a liquid-cooled cold rail and an electronics subassembly, in accordance with an aspect of the present invention.
Figure 8B:
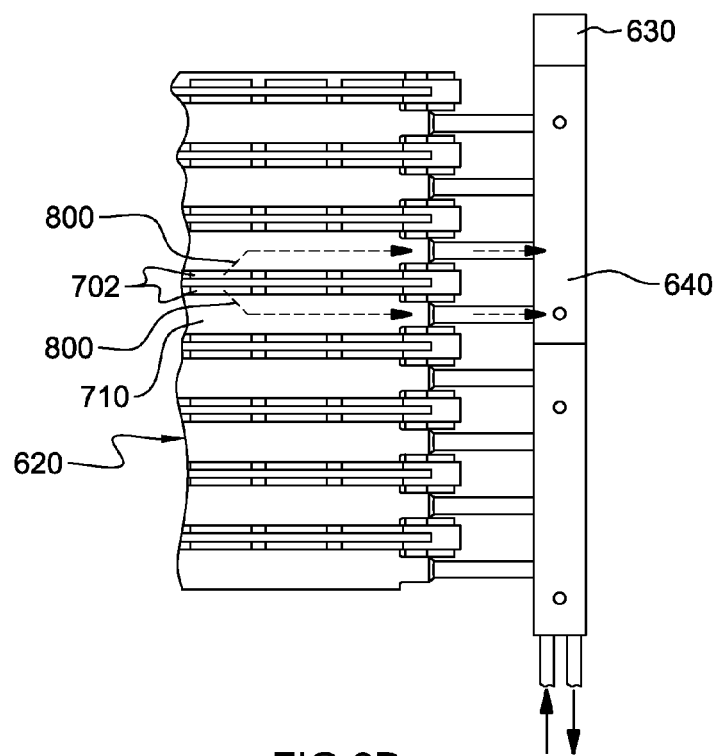
FIG. 8B is a plan view of the assembled cooled electronics apparatus of FIG. 8A, in accordance with an aspect of the present invention.

FIG. 7B illustrates a liquid-cooled cold rail 630 with threaded openings 731 sized and positioned to receive respective retention screws 741 from the thermal conduction blocks 640, with (by way of example only) two thermal conduction blocks being anticipated coupling to the top of the illustrated liquid-cooled cold rail 630 (see FIG. 8B). Liquid-cooled cold rail 630 is a thermally conductive structure having one or more coolant-carrying channels extending therein. In this embodiment, the coolant rail supply line 631 and coolant rail return line 632 are illustrated. The lower surface of liquid-cooled cold rail 630 has an elastomeric cold rail support structure 730 coupled thereto to facilitate proper positioning and thermal interfacing of the various components within the electronics subsystem illustrated in FIG. 6. Also illustrated in FIG. 7B are a plurality of card sockets 703 sized and positioned to receive the respective electronics cards 701 of the electronics subassembly 620 to be inserted into the electronics subsystem. In one embodiment, the lower edges of electronics cards 701 fit into respective channels in card sockets 703, with thermal transfer plates 710 being held therebetween by the fixed coupling of the plates to electronic devices 702, which are affixed to electronics cards 701.

FIGS. 8A & 8B depict the assembled cooled electronics apparatus of FIGS. 6-7B, comprising liquid-cooled cold rail 630 and electronics subassembly 620. As noted, electronics subassembly 620 includes a plurality of electronics cards 701 (each having a plurality of electronic devices 702 on the opposite main surfaces thereof), and a plurality of thermal transfer plates 710, each having a thermally conductive extension 711, which in one embodiment, is connected to thermal conduction block 640. In FIG. 8A, one electronics subassembly 620 is illustrated, while in FIG. 8B, two side-by-side electronic subassemblies 620 are illustrated. Each electronics subassembly 620 is thermally interfaced to liquid-cooled cold rail 630 via, for example, a thermal interface material and the retention screws which force and hold thermal conduction block 640 in physical contact with liquid-cooled cold rail 630. Note that in FIGS. 8A & 8B, electronics subassembly 620 is shown fully plugged into the associated card sockets 703. Arrows 800 depict the flow of heat from selected electronic devices, through the thermal transfer plates, and the thermal conduction block, into the liquid-cooled cold rail, and hence, to liquid coolant flowing through the liquid-cooled cold rail.

Note that the electronics subassembly 620 need not have four electronics cards or DIMM arrays, but rather, could have any number of electronics cards associated therewith, for example, one, two, three, four, etc. Advantageously, the heat from each electronic device (e.g., memory module) flows through a good, reliable and permanent thermal interface into thermal transfer plates 710 and is transported through the thermal transfer plates to thermal conduction block 640 by, for example, one or more heat pipes. Upon reaching thermal conduction block 640, the heat load is rejected into the coolant flowing through liquid-cooled cold rail 630 via another thermal interface between the thermal conduction block and the liquid-cooled cold rail. This thermal interface may be facilitated via a grease or a breakable metal thermal interface. An elastomeric support pad 730 is provided under liquid-cooled cold rail 630 to provide a degree of vertical compliance as the electronics subassembly, with the thermal conduction block affixed to the thermally conductive extensions therefrom comes into contact with the top surface of the liquid-cooled cold rail. The extensions, which in the embodiment depicted are heat pipe extensions, may be soldered into the thermal conduction block to ensure good thermal contact between the thermal transfer plates and the thermal conduction block.

Note that numerous modifications to the cooled electronics apparatus depicted in FIGS. 6-8B are possible without departing from the scope of the present invention. By way of example, FIGS. 9A-12 illustrate four such modified structures.

Figure 9A:
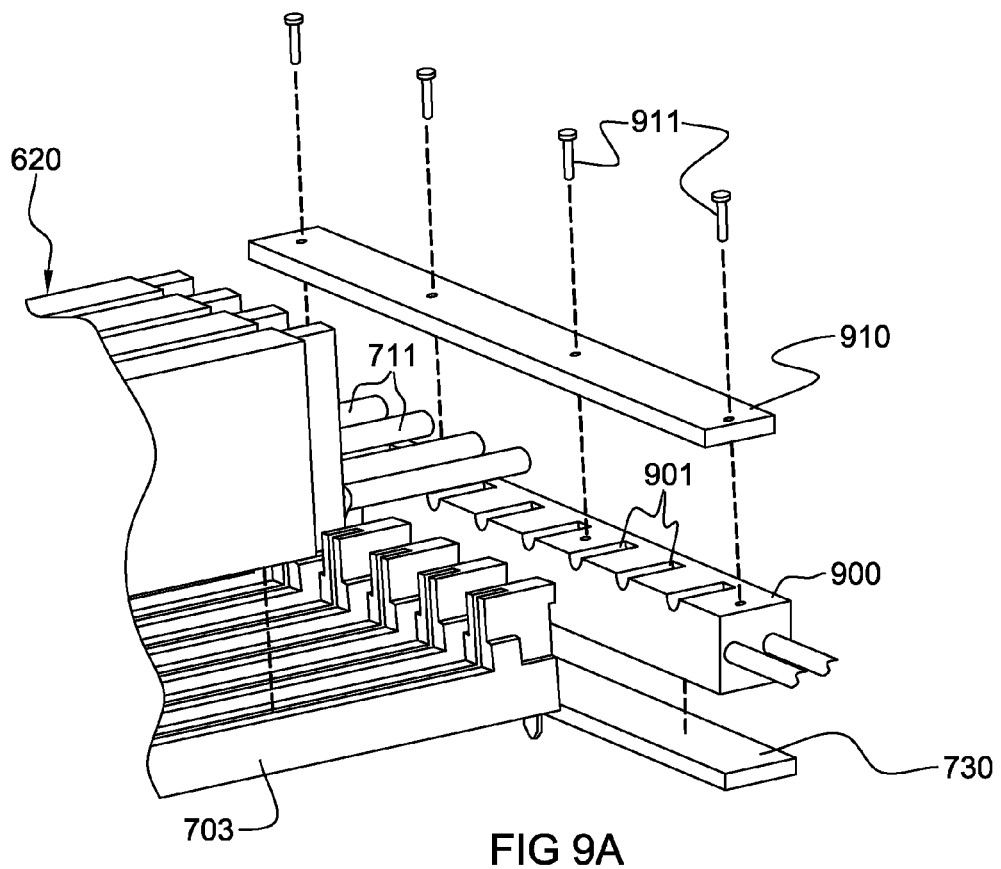
FIG. 9A is an exploded view of an alternate embodiment of a cooled electronics apparatus, in accordance with an aspect of the present invention.
Figure 9B:
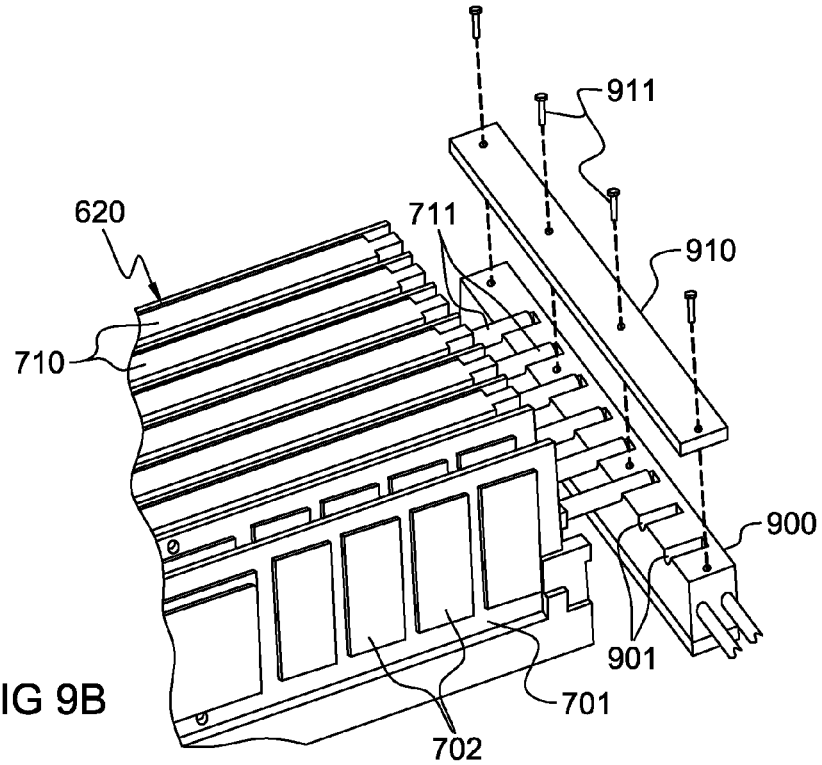
FIG. 9B depicts a partially assembled view of the cooled electronics apparatus of FIG. 9A, in accordance with an aspect of the present invention.

In FIGS. 9A & 9B, a cooled electronics apparatus is illustrated, wherein the thermal conduction block of the above-described embodiment is omitted. In this example, appropriately sized cylindrical-shaped, extension-receiving recesses 901 are provided within a liquid-cooled cold rail 900, positioned to receive the respective thermally conductive extensions 711 of thermal transfer plates 710 of the electronics subsystem(s) 620. Further, a cold rail cap 910 is shown, which is sized to seal thermal transfer plate extensions 711 into the respective extension-receiving recesses 901 in liquid-cooled cold rail 900. A plurality of retention screws 911 may be employed to securely affix thermal transfer plate extensions 711 into the respective extension-receiving recesses 901 of the liquid-cooled cold rail using cold rail cap 910. Note that one or more recesses may also be provided in the underside of cold rail cap 910 to better accommodate the shape of thermally conductive extensions 711 between the liquid-cooled cold rail and the cold rail cap.

In FIG. 9B, the electronics cards 701 are illustrated positioned within respective card sockets 703 (see FIG. 9A). Each electronics card 701 is shown to comprise (as one example) a plurality of electronic devices 702 disposed on the opposite main surfaces thereof which require cooling, either via forced airflow, or alternatively, via physical contact with respective thermal transfer plates 710 positioned between adjacent electronics cards, as illustrated. Advantageously, the cooled electronics apparatus embodiment of FIGS. 9A & 9B may have a lower vertical height than the embodiment illustrated in FIGS. 7A-8B. Note also that extension-receiving recesses 901 may be coated with a thermal grease, after which the electronics subassembly would be inserted, with the extensions received within the recesses. After each electronics subassembly has been satisfactorily plugged into the card sockets, with the thermally conductive extensions in the extension-receiving recesses, the cold rail cap may be affixed to the liquid-cooled cold rail, thus preventing (in part) leakage of the thermal grease. Note that two of the thermal transfer plates are not illustrated in FIG. 9B, to not interfere with depiction of the extension-receiving recesses 901 in the liquid-cooled cold rail 900.

Figure 10:
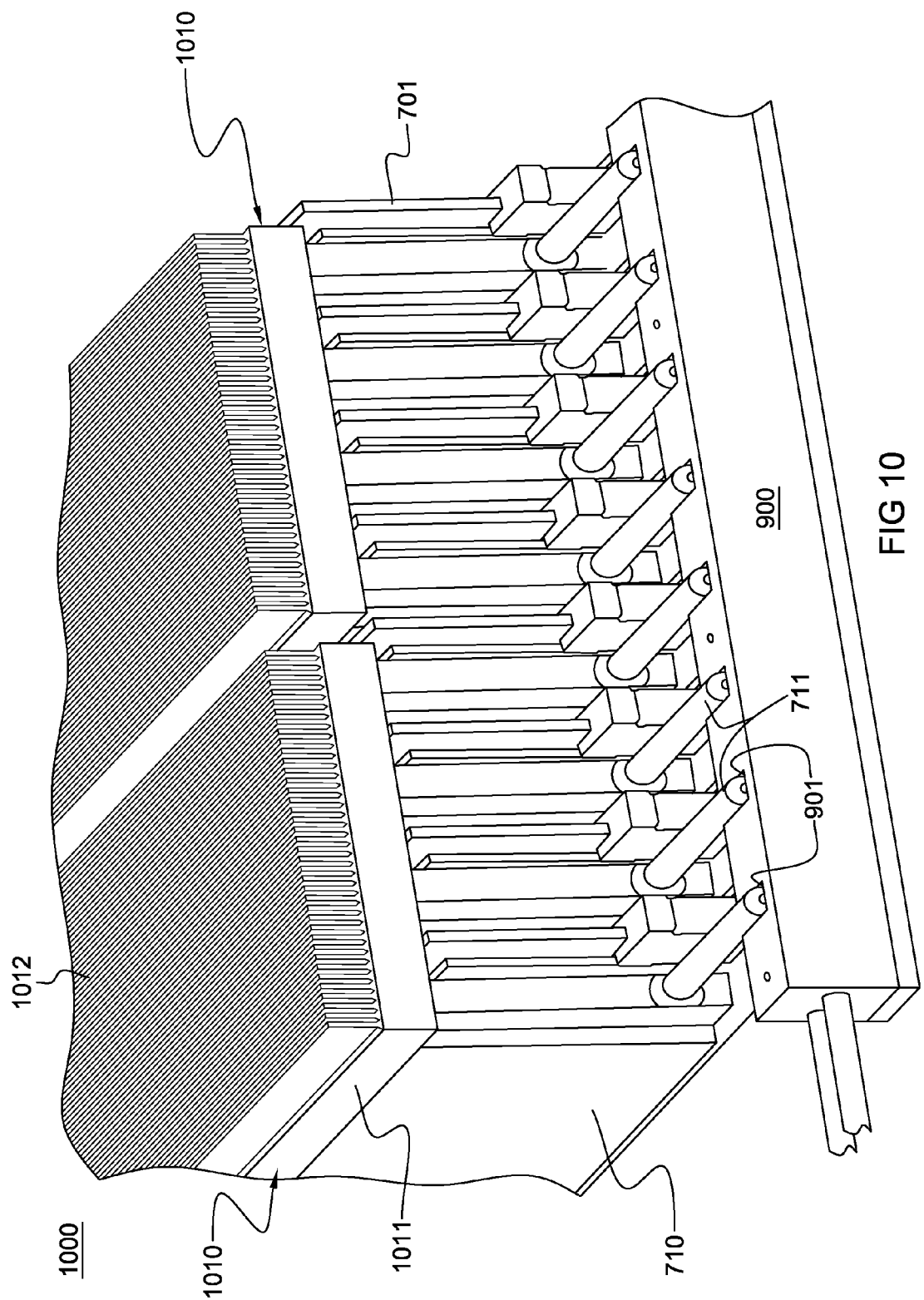
FIG. 10 depicts another embodiment of a cooled electronics apparatus, in accordance with an aspect of the present invention.

FIG. 10 depicts a further embodiment of a cooled electronics apparatus, generally denoted 1000, in accordance with an aspect of the present invention. Cooled electronics apparatus 1000 is similar to the cooled electronics apparatus illustrated in FIGS. 9A & 9B, and described above. In this embodiment, however, two air-cooled heat sinks 1010 are shown thermally coupled to thermal transfer plates 710 and disposed above the edges of interleaved electronics cards 701 and thermal transfer plates 710. In the example depicted, each air-cooled heat sink 1010 includes a thermally conductive base 1011 with a plurality of thermally conductive fins 1012 extending therefrom. In one example, thermally conductive fins 1012 may comprise a plurality of thermally conductive pin fins or a plurality of thermally conductive plate fins, which are air-cooled via air passing across the components of the electronics subsystem from the air inlet side to the air outlet side thereof (see FIG. 6). Air-cooled heat sinks 1010 advantageously supplement the liquid-cooling provided to the electronic devices via the liquid-cooled cold rail and thermal transfer plates. Additionally, the air-cooled heat sinks advantageously provide a measure of cooling to the electronic devices should coolant flow through the liquid-cooled cold rail(s) be interrupted for some reason. Note that in the depiction of FIG. 10, the cold rail cap of FIGS. 9A & 9B is not shown to better illustrate the heat pipe extensions within the respective extension-receiving recesses in the liquid-cooled cold rail.

Figure 11A:
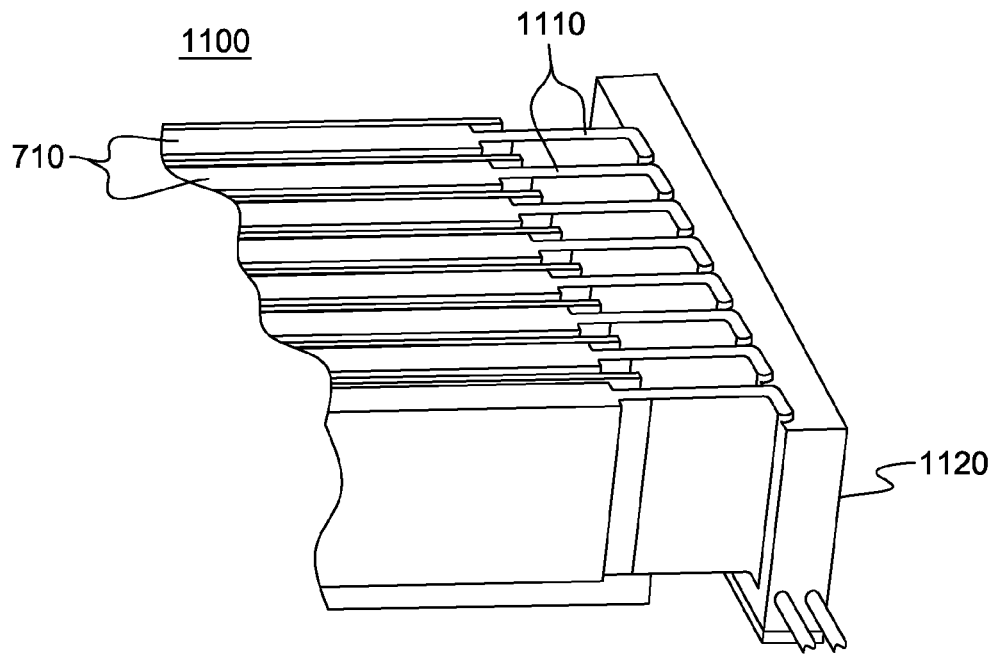
FIG. 11A illustrates still another embodiment of a cooled electronics apparatus, in accordance with an aspect of the present invention.
Figure 11B:
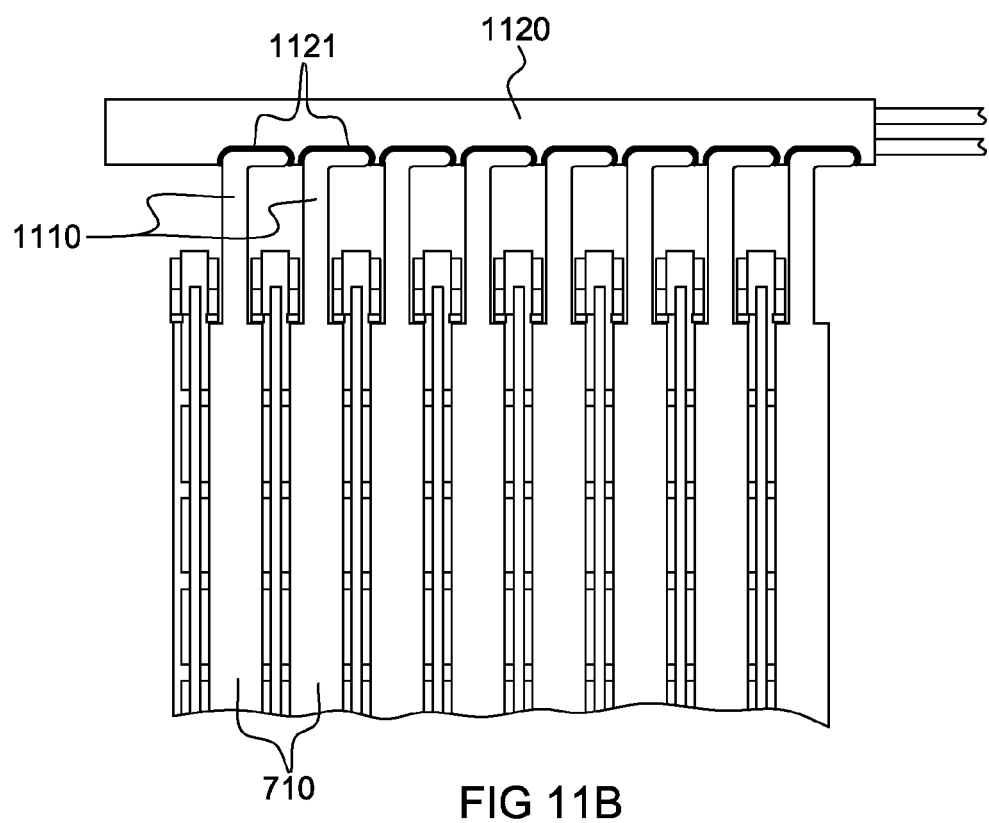
FIG. 11B is a plan view of the cooled electronics apparatus of FIG. 11A, in accordance with an aspect of the present invention.

FIGS. 11A & 11B depict a further embodiment of a cooled electronics apparatus generally denoted 1100, in accordance with an aspect of the present invention. In this embodiment, L-shaped extensions 1110 from respective thermal transfer plates 710 are illustrated each interfacing the respective thermal transfer plate with a liquid-cooled cold rail 1120 via a respective extension-receiving recess 1121 in liquid-cooled cold rail 1120. Note that in this example, liquid-cooled cold rail 1120 has a greater height in order to provide a larger surface area for direct mating of the L-shaped extensions 1110 to the side surface of liquid-cooled cold rail 1120. Note also that L-shaped extensions 1110 from the respective thermal transfer plates 710 may be heat pipe extensions configured in a flat, L-shaped structure, as illustrated. Such a thermal transfer plate implementation better conforms to the shape of the electronic devices (e.g., memory module arrays) being cooled, and provides one less thermal interface when transporting thermal energy from the electronic devices to the coolant flowing through the liquid-cooled cold rail. Advantageously, the L-shaped extensions increase the thermal contact area between the thermal transfer plates and the liquid-cooled cold rail. This configuration may be particularly advantageous when a narrow width liquid-cooled cold rail is required in view of a given electronics subsystem design.

Figure 12:
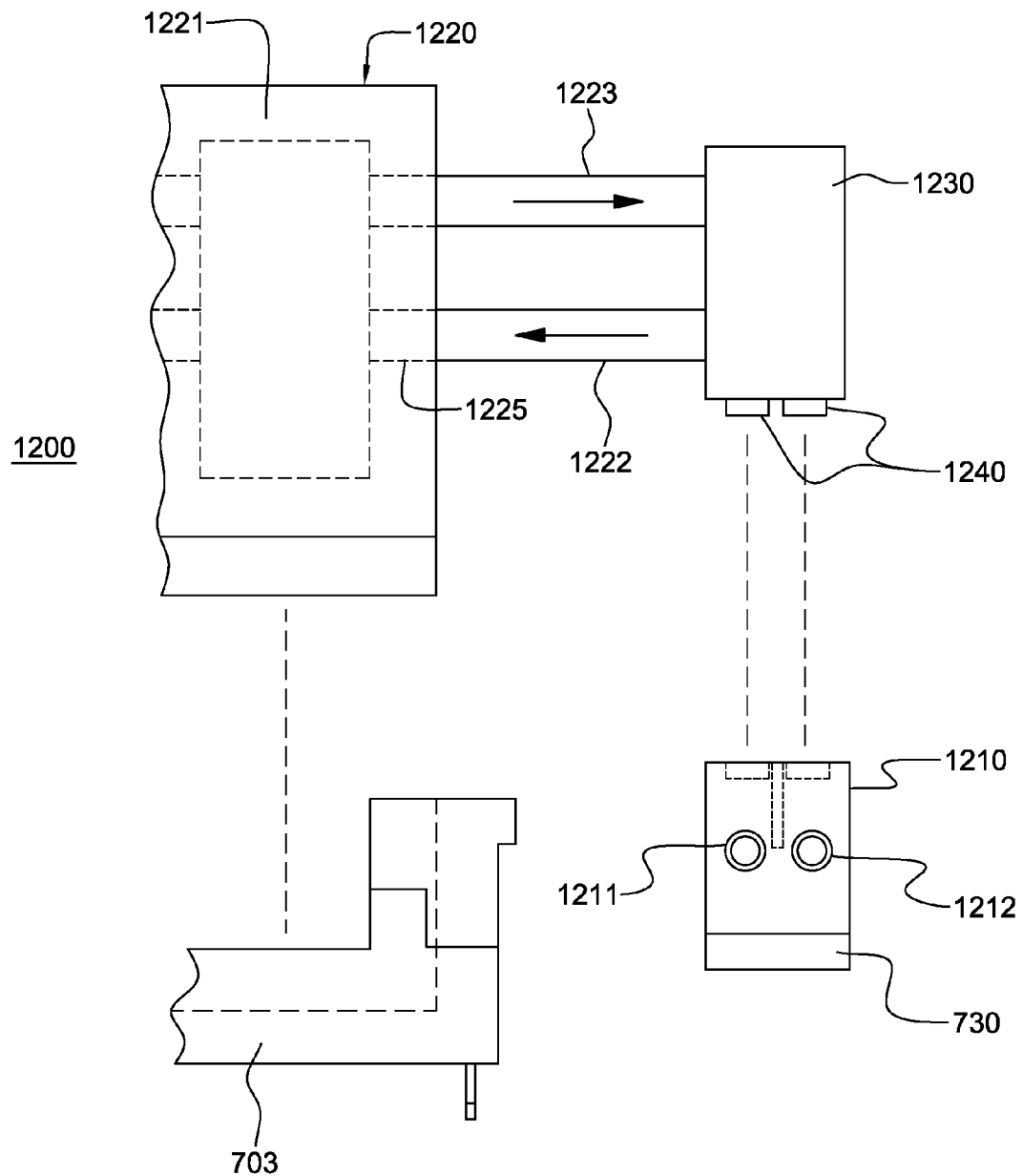
FIG. 12 is a partially exploded view of an alternate embodiment of a cooled electronics apparatus, wherein the liquid-cooled cold rail circulates coolant to the one or more thermal transfer plates coupled to the electronic devices to be cooled, in accordance with an aspect of the present invention.

FIG. 12 depicts a further embodiment of a cooled electronics apparatus 1200, in accordance with an aspect of the present invention. In this embodiment, cooled electronics apparatus 1200 includes a liquid-cooled cold rail 1210 having one or more coolant-carrying channels extending therein, wherein a coolant inlet and outlet port 1211, 1212, respectively, are illustrated. Further, an electronics subassembly 1220 is provided, which includes at least one thermal transfer plate rigidly affixed to at least one electronic device of at least one adjacent electronics card. The at least one thermal transfer plate 1221 includes at least one coolant-carrying channel 1225 extending therein, such that the plate is a vertically-oriented cold plate disposed between adjacent electronics cards containing the electronic devices to be cooled. A coolant inlet pipe 1222 and a coolant outlet pipe 1223 are provided to facilitate the flow of coolant through the thermal transfer plate(s). In this embodiment, thermal conduction block 1230 includes appropriate manifolding to provide cooled coolant from liquid-cooled cold rail 1210 to coolant supply line 1222 and to transfer exhausted coolant from coolant return line 1223 to liquid-cooled cold rail 1210. Appropriate quick connect couplings 1240 may be provided to facilitate coupling in fluid communication the coolant inlet and outlet manifolds of the thermal conduction block 1230 with the appropriate manifolds (or lines) within the liquid-cooled cold rail 1210. Note that each thermally conductive plate is rigidly affixed to the electronic device(s) (e.g., memory modules) on the adjacent electronics card(s). Also, fluidic connections between the electronics subassembly and the thermal conduction block (i.e., the coolant manifold block) are facilitated through the use of blind-mate connect couplings, such that with insertion of the electronics assembly into contact with the liquid-cooled cold rail, coolant flow paths are established between the liquid-cooled cold rail and the thermal transfer plate.

Figure 13A:
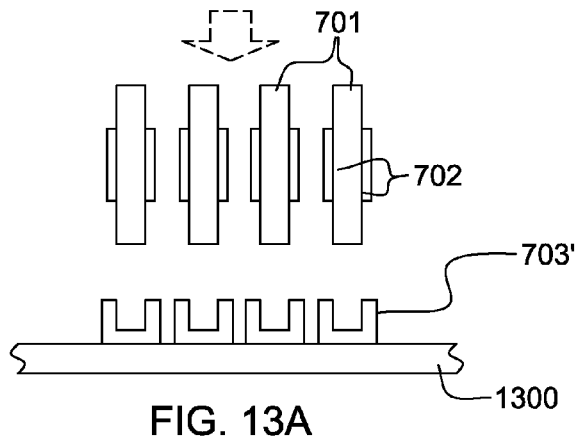
FIGS. 13A-13F depict one embodiment of a method of fabricating an electronics subassembly of a cooled electronics apparatus, in accordance with an aspect of the present invention.
Figure 13B:
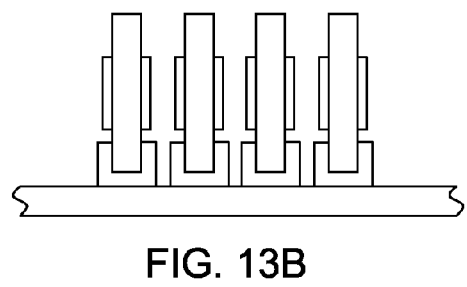
Figure 13C:
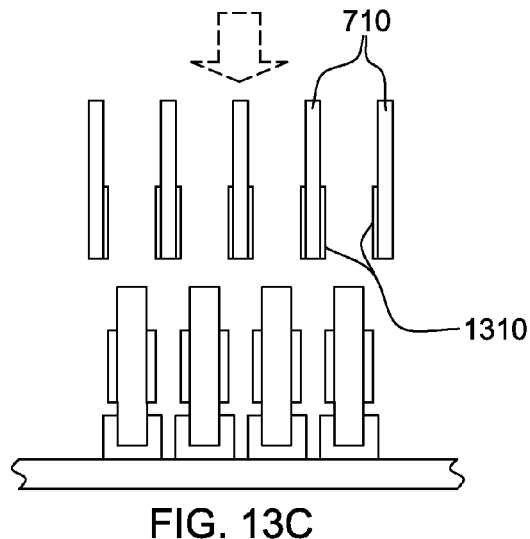
Figure 13D:
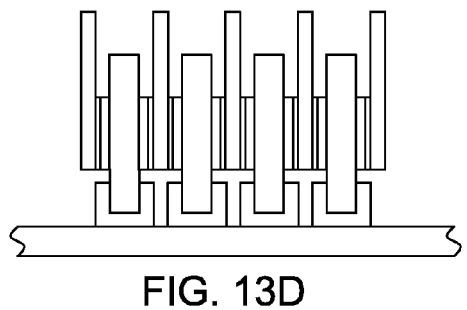
Figure 13E:
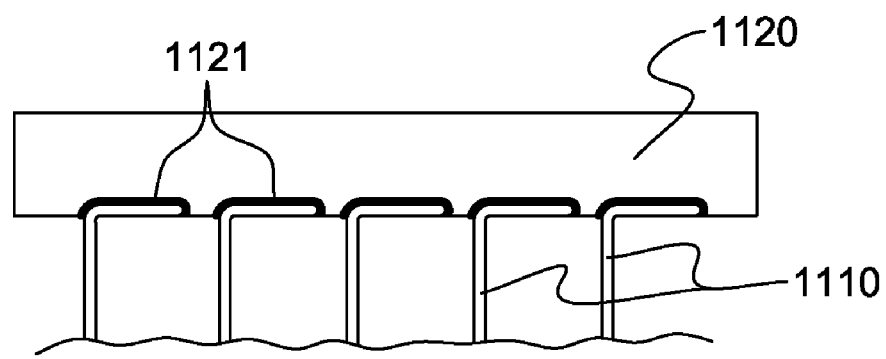
Figure 13F:
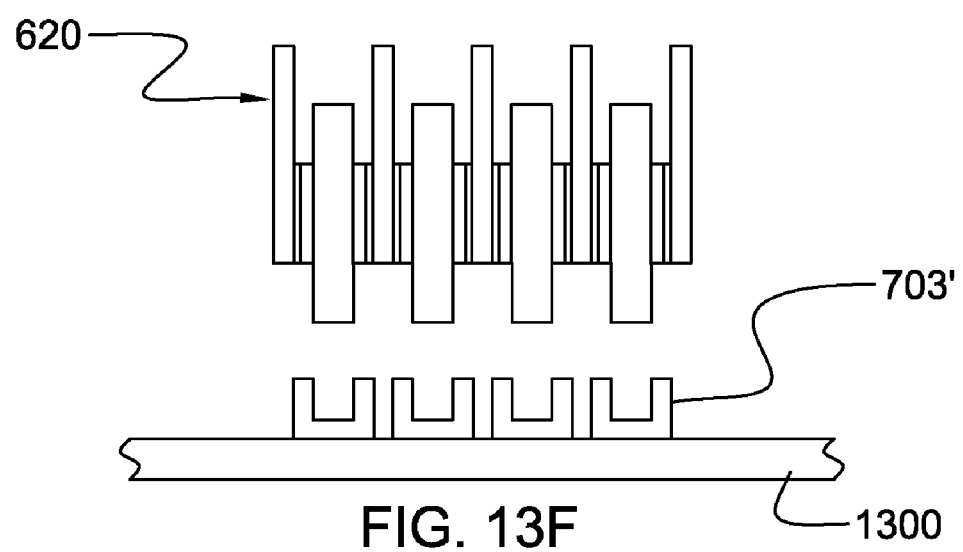

FIGS. 13A-13F depict one embodiment of a method of fabricating an electronics subassembly 620 (see FIG. 13F) for a cooled electronics apparatus, in accordance with an aspect of the present invention. Note that two solder re-flow processes are used in the processes described below with reference to FIGS. 13A-13F. These processes utilize two different solder materials, namely, a higher melting point solder (FIGS. 13C & 13D) and a lower melting point solder (FIG. 13F). Both these solder processes result in maximum ambient temperatures that are lower than the melting point for the solder used in the C4 structures in the DIMM cards.

In FIG. 13A, a plurality of electronics cards 701 with one or more electronic devices 702 on opposite main surfaces thereof are inserted into respective fixture sockets 703' affixed to a fixture board 1300. Fixture sockets 703' closely resemble the actual electrical sockets 703 (see FIG. 7B) to be employed within an electronics subsystem to which the electronics subassembly is to be connected. FIG. 13B illustrates the electronics cards with the electronic devices connected thereto fully engaged in fixture sockets 703'. In one embodiment, the electronic devices (e.g., memory chips) are metalized for appropriate wetting when the device back surfaces are exposed to reflowing solder. After insertion into the fixture sockets, thermal transfer plates, each with appropriately positioned solder pre-forms 1310, are placed into contact with the adjacent electronics devices on the cards. This is illustrated in FIG. 13C, wherein a mechanical force may be employed to position the thermal transfer plates with the high melting point solder foils already attached thereto into position in an interleaved manner between the electronics cards held by the fixture sockets. After insertion of the thermal transfer plates into position, the fixtured assembly is heated in an oven to re-flow the solder, thus permanently attaching the thermal transfer plates to the electronic devices, as illustrated in FIG. 13D. The oven temperature during this re-flow may be 5° C.-25° C. above the melting point of the higher melting point solder. The assembly is then removed from the oven after the first re-flow process.

FIG. 13E depicts the assembly being affixed to a thermal conduction block 1120, such as described above. In this figure, thermally conductive extensions 1110 from the thermal transfer plates (which in one embodiment, may comprise heat pipe extensions), are placed into respective recesses (or notches) in thermal conduction block 1120, which have been seeded with a lower melting point solder pre-form. Once positioned within the extension-receiving recesses 1121 (or notches), the lower melting point solder (than used in FIGS. 13C & 13D) is re-flowed in an oven at the low solder melting point plus 5° C.-25° C. to permanently join the thermally conductive extensions to the thermal conduction block. After this second re-flow process and a cool-down step, the electronics subassembly 620 (see FIG. 13F) is removed from the fixture and can subsequently be shipped for insertion into the electronics subsystem (e.g., server node of a rack of server nodes).

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooled electronics system comprising:
 a liquid-cooled cold rail comprising a thermally conductive structure with at least one coolant-carrying channel extending therein; and
 an electronics subassembly, the electronics subassembly being field-replaceable as a single unit, and comprising:
  multiple electronics cards, each electronics card of the multiple electronics cards comprising opposite first and second surfaces, and each of the opposite first and second surfaces supporting at least one respective electronic device to be cooled; and
  multiple thermal transfer plates coupled to and interleaved with the multiple electronics cards, a thermal transfer plate of the multiple thermal transfer plates being disposed between two adjacent electronics cards of the multiple electronics cards, wherein the first surface of one electronics card of the two adjacent electronics cards is in spaced, opposing relation to the second surface of another electronics card of the two adjacent electronics cards, and the thermal transfer plate disposed between the two adjacent electronics cards comprises opposite first and second conduction surfaces, the first conduction surface being soldered or epoxyed to a surface of the at least one respective electronics device to be cooled supported on the first surface of the one electronics card of the two adjacent electronics cards, and the second conduction surface being soldered or epoxyed to a surface of the at least one respective electronic device to be cooled supported on the second surface of the other electronics card of the two adjacent electronics cards, and wherein the thermal transfer plate disposed between the two adjacent electronics cards is thermally conductive and comprises an extension from one end edge of the thermal transfer plate that is configured to couple the electronics subassembly, as a field-replaceable unit, to the liquid-cooled cold rail, the one end edge of the thermal transfer plate being disposed between the first conduction surface and the second conduction surface of the thermal transfer plate, and wherein the liquid-cooled cold rail is disposed within the electronics system and is positioned at the one end of the thermal transfer plate when the electronics subassembly is operatively positioned as the field-replaceable unit within the electronics system.

2. The cooled electronics system of claim 1, wherein the liquid-cooled cold rail disposed within the electronics system has a profile below that of the electronics subassembly when operatively positioned within the electronics system.

3. The cooled electronics system of claim 2, wherein the each electronics card of the multiple electronics cards comprises a dual in-line memory module (DIMM) card.

4. The cooled electronics system of claim 1, further comprising a compliant structure disposed beneath the liquid-cooled cold rail within the electronics system, the compliant structure facilitating alignment of the extension from the one end of the thermal transfer plate disposed between the two adjacent electronics cards to an extension-receiving recess in the liquid-cooled cold rail plate.

5. The cooled electronics system of claim 1, further comprising at least one thermal conduction block coupled to the liquid-cooled cold rail, wherein each thermal transfer plate of the multiple thermal transfer plates couples the electronics subassembly to the liquid-cooled cold rail across the at least one thermal conduction block, and thereby thermally interfaces the e electronics subassembly to the liquid-cooled cold rail across the at least one thermal conduction block.

6. The cooled electronics system of claim 1, wherein the thermal transfer plate disposed between the two adjacent electronics cards further comprises at least one heat pipe embedded within the thermal transfer plate and extending from the thermal transfer plate as part of the extension from the one end edge, the at least one heat pipe extending from the thermal transfer plate facilitating thermal interfacing of the respective electronic device of each of the two adjacent electronics cards affixed to the thermal transfer plate to the liquid-cooled cold rail.

7. The cooled electronics system of claim 6, wherein the liquid-cooled cold rail further comprises an extension-receiving recess within the liquid-cooled cold rail configured to receive a portion of the at least one heat pipe extending from the thermal transfer plate disposed between the two adjacent electronics cards, and thereby facilitate coupling of the at least one heat pipe to the liquid-cooled cold rail.

8. The cooled electronics system of claim 7, further comprising a cold rail cap disposed over the portion of the at least one heat pipe extending from the thermal transfer plate and received within the extension-receiving recess of the liquid-cooled cold rail to facilitate thermal interfacing of the respective electronic device of each of the two adjacent electronics cards affixed to the thermal transfer plate disposed between the two adjacent electronics cards to the liquid-cooled cold rail.

9. The cooled electronics system of claim 1, wherein the extension of the one edge of the thermal transfer plate disposed between the two adjacent electronics cards is an L-shaped extension to facilitate coupling of the electronics subassembly to the liquid-cooled cold rail, and thus, thermal interfacing of the respective electronic device of each of the two adjacent electronics cards affixed to the thermal transfer plate disposed between the two adjacent electronics cards to the liquid-cooled cold rail.

10. The cooled electronics system of claim 1, wherein the thermal transfer plate disposed between the two adjacent electronics cards further comprises at least one second coolant-carrying channel extending within the thermal transfer plate, and wherein the thermal transfer plate disposed between the two adjacent electronics cards is coupled in fluid communication with the at least one coolant-carrying channel of the liquid-cooled cold rail to facilitate cooling of the electronic devices affixed to the thermal transfer plate.

11. The cooled electronics system of claim 1, further comprising an air-cooled heat sink coupled to the electronics subassembly and residing over the multiple electronics card cards and the multiple thermal transfer plate plates.

12. A liquid cooled electronics rack comprising:
the liquid cooled electronics rack comprising an electronics system;
a liquid-cooled cold rail associated with the electronics system, the liquid-cooled cold rail comprising a thermally conductive structure with at least one coolant-carrying channel extending therein; and
wherein the electronics system comprises an electronics subassembly, the electronics subassembly being field-replaceable as a single unit and comprising:
multiple electronics cards, each electronics card of the multiple electronics cards comprising opposite first and second surfaces, and each of the opposite first and second surfaces supporting at least one respective electronic device to be cooled;
multiple thermal transfer plates coupled to and interleaved with the multiple electronics cards, a thermal transfer plate of the multiple thermal transfer plates being disposed between two adjacent electronics cards of the multiple electronics cards, wherein the first surface of one electronics card of the two adjacent electronics cards is in spaced, opposing relation to the second surface of another electronics card of the two adjacent electronics cards, and the thermal transfer plate disposed between the two adjacent electronics cards comprises opposite first and second conduction surfaces, the first conduction surface being soldered or epoxyed to a surface of the at least one respective electronics device to be cooled supported on the first surface of the one electronics card of the two adjacent electronics cards, and the second conduction surface being soldered or epoxyed to a surface of the at least one respective electronic device to be cooled supported on the second surface of the other electronics card of the two adjacent electronics cards . . . and wherein the thermal transfer plate disposed between the two adjacent electronics cards is thermally conductive and comprises an extension from one end edge of the thermal transfer plate that is configured to couple the electronics subassembly, as a field-replaceable unit, to the liquid-cooled cold rail, the one end edge of the thermal transfer plate being disposed between the first conduction surface and the second conduction surface of the thermal transfer plate, and wherein the liquid-cooled cold rail is disposed within the electronics system and is positioned at the one end of the thermal transfer plate when the electronics subassembly is operatively positioned as the field-replaceable unit within the electronics system.

13. The liquid-cooled electronics rack of claim 12, the liquid-cooled cold rail disposed within the electronics system has a profile below that of the electronics subassembly when operatively positioned within the electronics system.

14. The liquid-cooled electronics rack of claim 12, wherein the each electronics card of the multiple electronics cards comprises a dual in-line memory module (DIMM) card.

15. The liquid-cooled electronics rack of claim 12, further comprising a compliant structure disposed beneath the liquid-cooled cold rail within the electronics system, the compliant structure facilitating alignment of the extension from the one end edge of the thermal transfer plate disposed between the two adjacent electronics cards to an extension-receiving recess in the liquid-cooled cold rail.

16. The liquid-cooled electronics rack of claim 12, wherein the thermal transfer plate disposed between the two adjacent electronics cards, further comprises at least one heat pipe embedded within the thermal transfer plate and extending from the thermal transfer plate as part of the extension, the at least one heat pipe extending from the thermal transfer plate facilitating thermal interfacing of the respective electronic device of each of the two adjacent electronics cards affixed to the thermal transfer plate to the liquid-cooled cold rail.

17. The liquid-cooled electronics rack of claim 12, wherein the extension of the one end edge of the thermal transfer plate disposed between the two adjacent electronics cards is an L-shaped extension to facilitate coupling of the electronics subassembly to the one liquid-cooled cold rail, and thus, thermal interfacing of the respective electronic device of each of the two adjacent electronics cards affixed to the thermal transfer plate disposed between the two adjacent electronics cards to the liquid-cooled cold rail.

18. The liquid-cooled electronics rack of claim 12, wherein the thermal transfer plate disposed between the two adjacent electronics cards further comprises at least one second coolant-carrying channel extending within the thermal transfer plate, and wherein the at least one second coolant-carrying channel of the thermal transfer plate disposed between the two adjacent electronics cards is coupled in fluid communication with the at least one coolant-carrying channel of the one liquid-cooled cold rail to facilitate cooling of the respective electronic device of each of the two adjacent electronics cards affixed to the thermal transfer plate disposed between the two adjacent electronics cards.

19. A method of fabricating a cooled electronics apparatus, the method comprising:
  providing within an electronics system a liquid-cooled cold rail, the liquid-cooled cold rail comprising a thermally conductive structure with at least one coolant-carrying channel extending within the thermally conductive structure;
  providing an electronics subassembly, the electronics subassembly field-replaceable as a single unit, and comprising:
    multiple electronics cards, each electronics card of the multiple electronics cards comprising opposite first and second surfaces, and each of the opposite first and second surfaces supporting at least one respective electronic device to be cooled; and
    multiple thermal transfer plates coupled to and interleaved with the multiple electronics cards, a thermal transfer plate of the multiple thermal transfer plates being disposed between two adjacent electronics cards of the multiple electronics cards, wherein the first surface of one electronics card of the two adjacent electronics cards is in spaced, opposing relation to the second surface of another electronics card of the two adjacent electronics cards, and the thermal transfer plate disposed between the two adjacent electronics cards comprises opposite first and second conduction surfaces, the first conduction surface being soldered or epoxyed to a surface of the at least one respective electronics device to be cooled supported on the first surface of the one electronics card of the two adjacent electronics cards, and the second conduction surface being soldered or epoxyed to a surface of the at least one respective electronic device to be cooled supported on the second surface of the other electronics card of the two adjacent electronics cards, and wherein the thermal transfer plate disposed between the two adjacent electronics cards is thermally conductive and comprises an extension from one end edge of the thermal transfer plate that is configured to couple the electronics subassembly, as a field-replaceable unit, to the liquid-cooled cold rail, the one end edge of the thermal transfer plate being disposed between the first conduction surface and the second conduction surface of the thermal transfer plate, and wherein the liquid-cooled cold rail is disposed within the electronics system and is positioned at the one end of the thermal transfer plate when the electronics subassembly is operatively positioned as the field-replaceable unit within the electronics system; and
  operatively positioning the electronics subassembly within the electronics system, the operatively positioning comprising coupling the extension of the thermal transfer plate disposed between the two adjacent electronics cards to the liquid-cooled cold rail to thermally interface the electronics subassembly to the liquid-cooled cold rail to facilitate cooling thereof.

20. The method of claim 19, the liquid-cooled cold rail disposed within the electronics system has a profile below that of the electronics subassembly when operatively positioned within the electronics system.

* * * * *